United States Patent
Jung et al.

(10) Patent No.: US 9,012,994 B2
(45) Date of Patent: Apr. 21, 2015

(54) THIN FILM TRANSISTOR ARRAY PANEL AND METHOD FOR MANUFACTURING THE SAME

(71) Applicant: Samsung Display Co., Ltd., Yongin, Gyeonggi-Do (KR)

(72) Inventors: Seung-Ho Jung, Yongin (KR); Young Joo Choi, Anyang-si (KR); Joon Geol Kim, Hwaseong-si (KR); Kang Moon Jo, Seoul (KR); Sho Yeon Kim, Hwaseong-si (KR); Byung Hwan Chu, Hwaseong-si (KR); Woo Geun Lee, Yongin-si (KR); Woo-Seok Jeon, Seoul (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/012,580

(22) Filed: Aug. 28, 2013

(65) Prior Publication Data
US 2014/0332889 A1 Nov. 13, 2014

(30) Foreign Application Priority Data
May 8, 2013 (KR) .......................... 10-2013-0052022

(51) Int. Cl.
H01L 27/12 (2006.01)
(52) U.S. Cl.
CPC ........ *H01L 27/1214* (2013.01); *H01L 27/1259* (2013.01)
(58) Field of Classification Search
CPC .......................... H01L 27/1225; H01L 29/7869
USPC .......................................................... 257/347
See application file for complete search history.

(56) References Cited

U.S. PATENT DOCUMENTS

| | | | |
|---|---|---|---|
| 2009/0170334 A1 | 7/2009 | Fang et al. | |
| 2012/0112181 A1* | 5/2012 | Lee et al. | 257/43 |
| 2012/0168757 A1 | 7/2012 | Park et al. | |
| 2013/0299817 A1 | 11/2013 | Park et al. | |
| 2013/0306972 A1 | 11/2013 | Ryu et al. | |
| 2014/0332760 A1* | 11/2014 | Nishimura et al. | 257/40 |

FOREIGN PATENT DOCUMENTS

| | | |
|---|---|---|
| KR | 10-0274342 B1 | 1/2001 |
| KR | 10-0640947 | 10/2006 |
| KR | 10-0702802 B1 | 4/2007 |
| KR | 10-2012-0083725 A | 7/2012 |
| KR | 10-2013-0126240 | 11/2013 |
| KR | 10-2013-0129673 | 11/2013 |

OTHER PUBLICATIONS

Passivation Effect during the C4F8 + N2 Etch Process for SiOCH Low-k Films, Journal of the Korean Physics Society, vol. 52, No. 6, Jun. 2008, pp. 1786-1791.

* cited by examiner

*Primary Examiner* — Lex Malsawma
*Assistant Examiner* — Patricia Reddington
(74) *Attorney, Agent, or Firm* — Knobbe, Martens, Olson & Bear LLP

(57) ABSTRACT

A thin film transistor array panel is disclosed. The thin film transistor array panel may include a gate line disposed on a substrate and including a gate electrode, a semiconductor layer including an oxide semiconductor disposed on the substrate, a data wiring layer disposed on the substrate and including a data line crossing the gate line, a source electrode connected to the data line and a drain electrode facing the source electrode, a polymer layer covering the source electrode and the drain electrode, and a passivation layer disposed on the polymer layer. The data wiring layer may include copper or a copper alloy and the polymer layer may include fluorocarbon.

10 Claims, 11 Drawing Sheets

THIN FILM TRANSISTOR ARRAY PANEL AND METHOD FOR MANUFACTURING THE SAME

CROSS-REFERENCE TO RELATED APPLICATION

Any and all priority claims identified in the Application Data Sheet, or any correction thereto, are hereby incorporated by reference under 37 CFR 1.57. For example, this application claims priority to and the benefit of Korean Patent Application No. 10-2013-0052022 filed in the Korean Intellectual Property Office on May 8, 2013, the entire contents of which are incorporated herein by reference.

BACKGROUND

1. Field

The present disclosure relates to a thin film transistor array panel and a method for manufacturing the same.

2. Description of the Related Technology

In general, a flat panel display such as a liquid crystal display or an organic light emitting device includes a plurality of pairs of electric field generating electrodes with electro-optical active layers interposed therebetween. The liquid crystal display includes a liquid crystal layer as an electro-optical active layer. The organic light emitting device includes an organic light emission layer as an electro-optical active layer. One of the electric field generating electrodes that forms a pair is generally connected to a switching element. During operation an electric signal is applied to the switching element and the electro-optical active layer converts the electric signal into an optical signal to display an image. The flat panel display includes a thin film transistor (TFT) is a three-terminal element used as a switching element and a signal line such as a gate line for transferring a scanning signal for controlling the thin film transistor and a data line for transferring a signal to be applied to a pixel electrode.

As display device display area increases, oxide semiconductor technology, high-speed driving, and methods for reducing resistance of the signal line are being researched. For example, a main wiring layer may be formed of a material copper or copper alloy to reduce resistance of the signal line. In this case, the copper is diffused within a semiconductor layer formed by an oxide semiconductor, and as a result, reliability of the device deteriorates.

The above information disclosed in this Background section is only for enhancement of understanding of the disclosure and therefore it may contain information that does not form the prior art already known to a person of ordinary skill in the art.

SUMMARY OF CERTAIN INVENTIVE ASPECTS

In a first aspect, a thin film transistor array panel is provided, which may include, for example, a polymer layer interposed between a main wiring layer and a passivation layer.

In another aspect, a method for manufacturing a thin film transistor array panel including a plasma-processing a main wiring layer is provided.

In another aspect, a thin film transistor array panel is provided. The thin film transistor array panel, includes, for example, a gate line disposed on a substrate and including a gate electrode, a semiconductor layer formed with an oxide semiconductor, a data wiring layer including a data line crossing the gate line, a source electrode connected to the data line and a drain electrode facing the source electrode, a polymer layer covering the source electrode and the drain electrode, and a passivation layer disposed on the polymer layer.

In some embodiments, the data wiring layer is formed from copper or a copper alloy. In some embodiments, the polymer layer is formed from a fluorocarbon. In some embodiments, lateral surfaces of the source electrode and the drain electrode may be exposed adjacent to a channel region of the semiconductor layer. In some embodiments, the channel region of the semiconductor layer includes an exposed portion which is not covered by the source electrode and the drain electrode between the source electrode and the drain electrode. In some embodiments, the polymer layer may cover the exposed lateral surface of the source electrode and the exposed lateral surface of the drain electrode. In some embodiments, the data wiring layer may include a barrier layer, and a main wiring layer disposed on the barrier layer. In some embodiments, the main wiring layer may be formed from copper and/or copper alloy. In some embodiments, the barrier layer may be formed from a metal oxide. In some embodiments, the passivation layer may include a lower passivation layer and an upper passivation layer. In some embodiments, the lower passivation layer may be formed of a silicon oxide. In some embodiments, the upper passivation layer may be formed from a silicon nitride. In some embodiments, the lower passivation layer may contact the polymer layer covering the exposed lateral surface of the source electrode and the exposed lateral surface of the drain electrode.

In some embodiments, the barrier layer may be formed from at least one of an indium-zinc oxide (IZO), a gallium-zinc oxide (GZO), and an aluminum-zinc oxide (AZO). In some embodiments, the polymer may cover the channel region. In some embodiments, the thin film transistor array panel may further include a gate insulating layer. In some embodiments, the gate insulating layer may be formed of at least one of a silicon oxide, a silicon nitride, and a silicon oxide nitride. In some embodiments, the polymer layer may contain octafluorocyclobutane ($C_4F_8$). In some embodiments, the semiconductor layer may have a same plane pattern as the source electrode, the drain electrode, and/or the data line except for the channel region.

In another aspect, a method for manufacturing a thin film transistor array panel is provided. The method may include, for example, forming a gate line including a gate electrode on a substrate, forming a gate insulating layer on the gate line, forming a semiconductor layer including an oxide semiconductor on the gate insulating layer, forming a data wiring layer including a source electrode and a drain electrode on the semiconductor layer, forming a polymer layer by fluorocarbon plasma-processing the surfaces of the source electrode and the drain electrode, and forming a passivation layer on the substrate to cover the polymer layer.

In some embodiments, the data wiring layer is formed from copper or copper alloy. In some embodiments, the forming of the data wiring layer may include forming a barrier layer on the semiconductor layer and forming a main wiring layer on the barrier layer. In some embodiments, the main wiring layer may be formed from copper or a copper alloy. In some embodiments, the barrier layer may be formed from a metal oxide. In some embodiments, the forming of the semiconductor layer and the forming of the data wiring layer may be simultaneously performed by using a mask. In some embodiments of the semiconductor layer, an exposed portion which is not covered by the source electrode and the drain electrode may be formed between the source electrode and the drain electrode. In some embodiments, the exposed semiconductor layer portion may form a channel region. In some embodiments, the polymer layer may be formed to cover respective exposed lateral surfaces of the source electrode and the drain electrode adjacent to the channel region as part of the forming of the data wiring layer.

In some embodiments, the forming of the passivation layer may include forming a lower passivation layer on the polymer layer and forming an upper passivation layer on the lower passivation layer. In some embodiments, the lower passivation layer may be formed from a silicon oxide. In some embodiments, the upper passivation layer may be formed from a silicon nitride. In some embodiments, the forming of the lower passivation layer includes forming the lower passivation to contact the polymer layer at the exposed lateral surface of the source electrode and/or at the exposed lateral surface of the drain electrode. In some embodiments, the polymer layer may be formed to cover the channel region. In some embodiments, the barrier layer may be formed to contain one of an indium-zinc oxide (IZO), a gallium-zinc oxide (GZO), and an aluminum-zinc oxide (AZO). In some embodiments, a gate insulating layer may be formed from at least one of a silicon oxide, a silicon nitride, and a silicon oxide nitride. In some embodiments, the polymer layer may be formed from octafluorocyclobutane ($C_4F_8$).

In some embodiments of the present disclosure a polymer layer includes a structure of covering a main wiring layer part exposed during a process to suppress a material forming a main wiring layer from being oxidized, thereby improving reliability. Further, since a capping film formed on the main wiring layer can be omitted, process cost can be reduced.

BRIEF DESCRIPTION OF THE DRAWINGS

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus, system or method according to some of the described embodiments can have several aspects, no single one of which necessarily is solely responsible for the desirable attributes of the apparatus, system or method. After considering this discussion, and particularly after reading the section entitled "Detailed Description of Certain Inventive Embodiments" one will understand how illustrated features serve to explain certain principles of the present disclosure.

DETAILED DESCRIPTION OF CERTAIN INVENTIVE EMBODIMENTS

Figure 1:
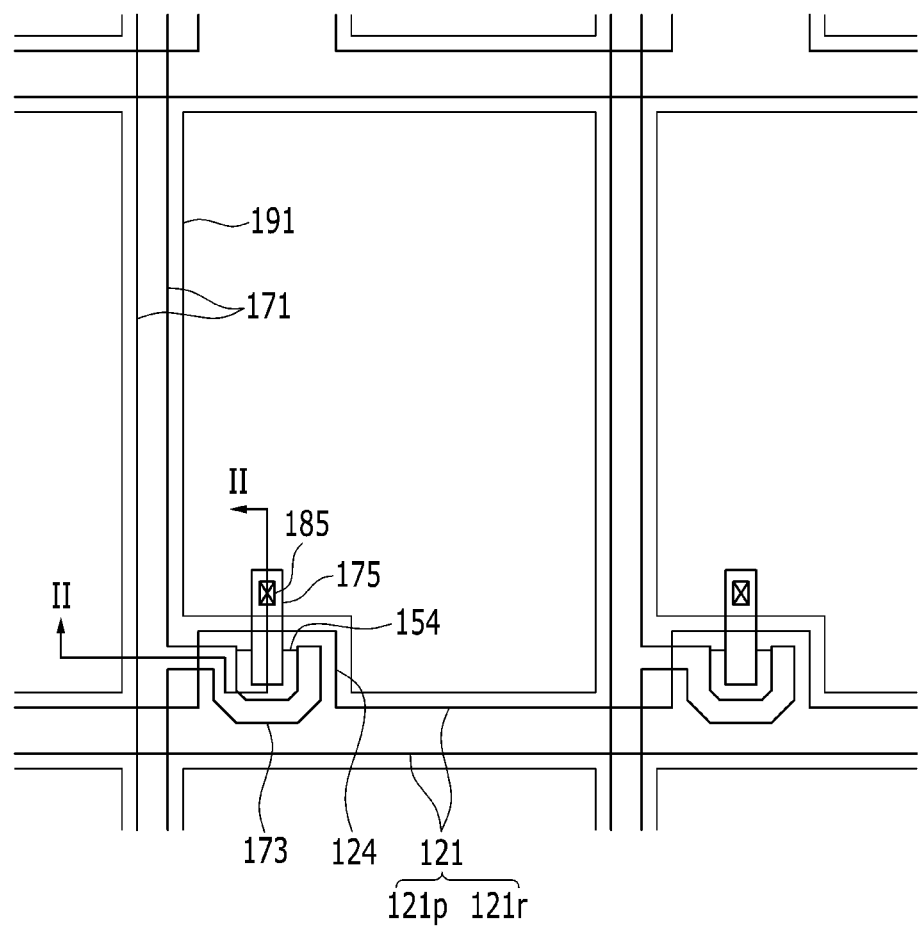
FIG. 1 is a plan view illustrating a thin film transistor array panel according to an exemplary embodiment of the present disclosure.

Exemplary embodiments of the present invention will be described with reference to the accompanying drawings. However, the present invention is not limited to the exemplary embodiments described herein, but may be embodied in another similar form. Still, the exemplary embodiments introduced herein are provided to make the disclosed contents to be fully complete and the spirit of the present invention is sufficiently conveyed to those skilled in the art. In the drawings, the thickness of layers and regions are exaggerated for clarity. Further, as described herein when a predetermined layer is "on" another layer or substrate, the layer may be formed directly on another layer or substrate or a third layer may be interposed therebetween. Like reference numerals designate like elements throughout the specification.

Figure 2:
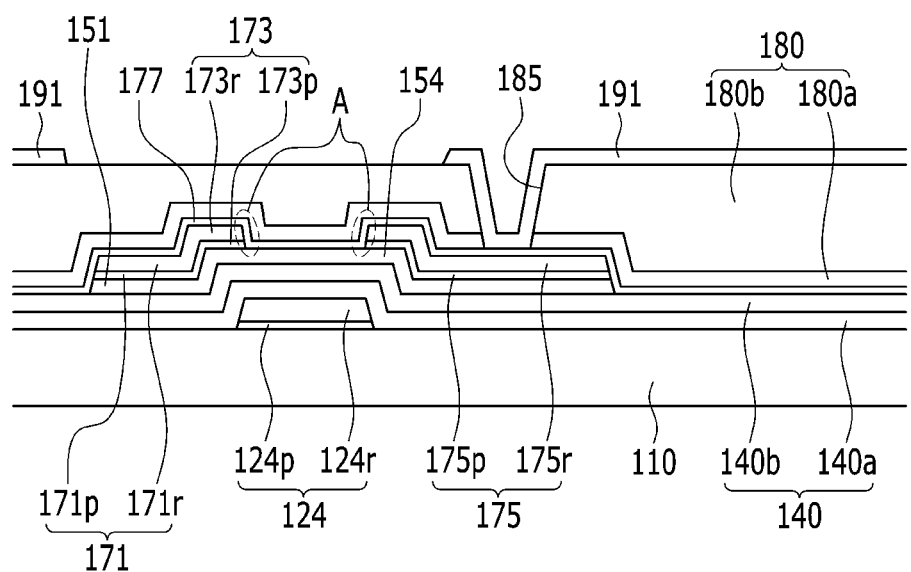
FIG. 2 is a cross-sectional view taken along the line II-II of FIG. 1.

FIG. 1 is a plan view illustrating a thin film transistor array panel according to an exemplary embodiment of the present disclosure. FIG. 2 is a cross-sectional view taken along the line II-II of FIG. 1. Referring to FIGS. 1 and 2, a thin film transistor array panel 100 according to an exemplary embodiment of the present disclosure includes a plurality of gate lines 121 formed on an insulation substrate 110 formed of transparent glass or plastic. The gate lines 121 transfer gate signals and extends primarily in a horizontal direction. Each gate line 121 includes a plurality of gate electrodes 124 that protrudes from the gate line 121. The gate line 121 and the gate electrode 124 may have a dual-film structure constituted by first layers 121p, 124p and second layers 121r, 124r, respectively. Each of the first layers 121p and 124p and the second layers 121r and 124r may be formed of aluminum based metal such as aluminum (Al) and an aluminum alloy, silver based metal such as silver (Ag) and a silver alloy, copper based metal such as copper (Cu) and/or a copper alloy, molybdenum based metal such as molybdenum (Mo) and a molybdenum alloy, chrome (Cr), titanium (Ti), tantalum (Ta), manganese (Mn), or the like. For example, the first layers 121p and 124p may contain titanium and the second layers 121r and 124r may contain copper and/or copper alloy.

Further, the first layers 121p and 124p and the second layers 121r and the 124r may be formed by combinations of films having different physical properties. In the exemplary embodiment, the gate line 121 and the gate electrode 124 are formed in dual films, but are not limited thereto and may be formed in a single-film or triple-film pattern.

A gate insulating layer 140 formed of an insulating material such as a silicon oxide or a silicon nitride is disposed on the gate line 121. The gate insulating layer 140 may include a first insulating layer 140a and a second insulating layer 140b. The first insulating layer 140a may be formed of a silicon nitride (SiNx) having a thickness of approximately 4000 Å and the second insulating layer may be formed of a silicon oxide (SiO$_2$) having a thickness of approximately 500 Å. As another exemplary embodiment, the first insulating layer 140a may be formed of a silicon oxide nitride (SiON) and the second insulating layer 140b may be formed of a silicon oxide (SiO$_2$). In the exemplary embodiment, the gate insulating layers 140a and 140b are formed in the dual-film pattern, but may be formed in the single-film pattern.

A plurality of semiconductor layers 151 formed of the oxide semiconductor is formed on the gate insulating layer 140. The semiconductor layers 151 extend primarily in a vertical direction and include a plurality of projections 154 that protrudes toward the gate electrode 124. The semiconductor layer 151 contains at least one of zinc (Zn), indium (In), tin (Sn), gallium (Ga), and hafnium (Hf). For example, in the exemplary embodiment, the semiconductor layer 151 may be an indium-gallium-zinc.

A plurality of data lines 171, and a plurality of source electrodes 173 and a plurality of drain electrodes 175 connected to the data lines 171 are formed on the semiconductor layer 151 and the gate insulating layer 140. The data lines 171 transfer data signals and extend primarily in the vertical direction to cross the gate lines 121. The source electrode 173 may extend from the data line 171 to superimpose on the gate electrode 124 and may have substantially a U shape. The drain electrode 175 is separated from the data line 171 and extends upward from the center of the U shape of the source electrode 173. The data line 171, and the source electrode 173 and the drain electrode 175 have a dual-film structure of barrier layers 171p, 173p, and 175p and main wiring layers 171r, 173r, and 175r. The barrier layers 171p, 173p, and 175p are formed of a metal oxide and the main wiring layers 171r, 173r, and 175r are formed of copper or the copper alloy. In detail, the barrier layers 171p, 173p, and 175p may be formed by one of an indium-zinc oxide, a gallium-zinc oxide, and an aluminum-zinc oxide. The barrier layers 171p, 173p, and 175p serve as a diffusion preventing layer that prevents the material such as copper, or the like from being diffused to the semiconductor layer 151.

A polymer layer 177 is disposed on the main wiring layers 171r, 173r, and 175r. The polymer layer 177 contains fluorocarbon and may include, for example, octafluorocyclobutane ($C_4F_8$). In the exemplary embodiment, the polymer layer 177 covers the source electrode 173 and the drain electrode 175 while directly contacting the surfaces of the source electrode 173 and the drain electrode 175. In some embodiments the polymer layer 177 covers exposed lateral parts A of the source electrode 173 and the drain electrode 175. In some embodiments, the polymer layer 177 may be formed even on the projection 154 of the semiconductor layer 151 and the surface of the gate insulating layer 140. Hereinafter, the exposed lateral parts A of the source electrode 173 and the drain electrode 175 will be described.

Referring to FIG. 2, the projection 154 of the semiconductor layer 151 includes an exposed portion not covered by the data line 171 and the drain electrode 175 between the source electrode 173 and the drain electrode 175. The semiconductor layer 151 may have substantially the same plane pattern as the data line 171 and the drain electrode 175 except for the exposed portion of the projection 154.

One gate electrode 124, one source electrode 173, and one drain electrode 175 constitute one thin film transistor (TFT) together with the projection 154 of the semiconductor layer 151, and a channel region of the thin film transistor is formed on the projection 154 between the source electrode 173 and the drain electrode 175. Lateral surfaces of the source electrode 173 and the drain electrode 175 adjacent to the channel region are exposed and exposed lateral parts A of the source electrode 173 and the drain electrode 175 are covered with the polymer layer 177. When the exposed lateral parts A of the source electrode 173 and the drain electrode 175 contact the passivation layer containing a silicon oxide formed by a post-process without the polymer layer 177 or are subjected to heat-treatment to have a channel characteristic, the material such as copper, or the like in the main wiring layers 171r, 173r, and 175r forms an oxide to be diffused to the channel region. In the exemplary embodiment, the polymer layer 177 may prevent the material such as copper, or the like from being oxidized.

In the exemplary embodiment, the polymer layer 177 may be formed by plasma processing.

In the related art, an additional capping film may be formed even in upper parts of the main wiring layers 171r, 173r, and 175r as a diffusion preventing layer. In the thin film transistor array panel according to the exemplary embodiment, since the polymer layer is formed, the formation of the additional capping film may be omitted. Accordingly, sputtering cost required to form the capping film may be reduced and productivity may be increased.

In some embodiments a passivation layer 180 is formed on the polymer layer 177. The passivation layer 180 may be formed of an inorganic insulator such as a silicon nitride or a silicon oxide, an organic insulator, or a low-dielectric insulator. In the exemplary embodiment, the passivation layer 180 may include a lower passivation layer 180a and an upper passivation layer 180b. The lower passivation layer 180a may be formed of a silicon oxide and the upper passivation layer 180b may be formed of a silicon nitride. In the exemplary embodiment, since the semiconductor layer 151 includes the oxide semiconductor, the lower passivation layer 180a adjacent to the semiconductor layer 151 is preferably formed of a silicon oxide. When the lower passivation layer 180a is formed of a silicon nitride, a characteristic of the thin film transistor is not shown.

A plurality of contact holes 185 that exposes one end of the drain electrode 175 is formed on the passivation layer 180. A plurality of pixel electrodes 191 is formed on the passivation layer 180. The pixel electrode 191 is physically and electrically connected with the drain electrode 175 through the contact hole 185 and is applied with data voltage from the drain electrode 175. The pixel electrode 191 may be formed of a transparent conductor such as ITO or IZO.

FIGS. 3 to 10 are cross-sectional views illustrating a method for manufacturing a thin film transistor array panel according to an exemplary embodiment of the present disclosure. FIGS. 3 to 10 sequentially illustrate the cross-sectional views taken along the line II-II of FIG. 1.

Figure 3:
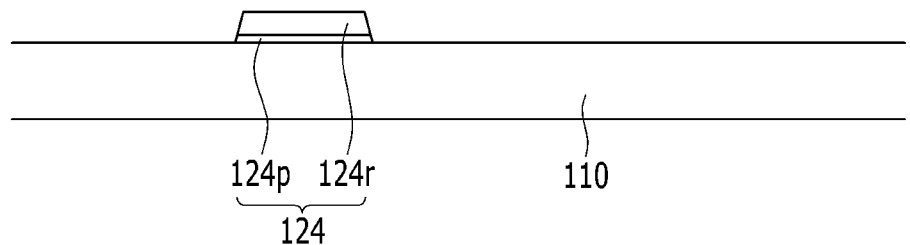
FIGS. 3 to 10 are cross-sectional views illustrating a method for manufacturing a thin film transistor array panel according to an exemplary embodiment of the present disclosure.

Referring to FIG. 3, at least one of the molybdenum based metal such as molybdenum (Mo) and the molybdenum alloy, chrome (Cr), the chrome alloy, titanium (Ti), the titanium alloy, tantalum (Ta), the tantalum alloy, manganese (Mn), and the manganese alloy is deposited on the insulation substrate 110 formed of the transparent glass or plastic, one selected from the aluminum based metal such as aluminum and the aluminum alloy, the silver based metal such as silver (Ag) and the silver alloy, and the copper based metal such as copper (Cu) and the copper alloy is deposited thereon to form and pattern the dual film to form the gate line 121 including the gate electrode 124. In some embodiments, the lower layers 121p and 124p may be formed from titanium and the upper layers 121r and 124r may be formed of copper or copper alloy. After the dual film is formed, photoresist (not illustrated) is deposited and patterned and thereafter, the lower layers 121p and 124p and the upper layers 121r and 124r are together etched by using the patterned photoresist (not illustrated) as a mask. In this case, as used etchant, etchant that can etch both the lower layers 121p and 124p and the upper layers 121r and 124r may be used.

Figure 4:
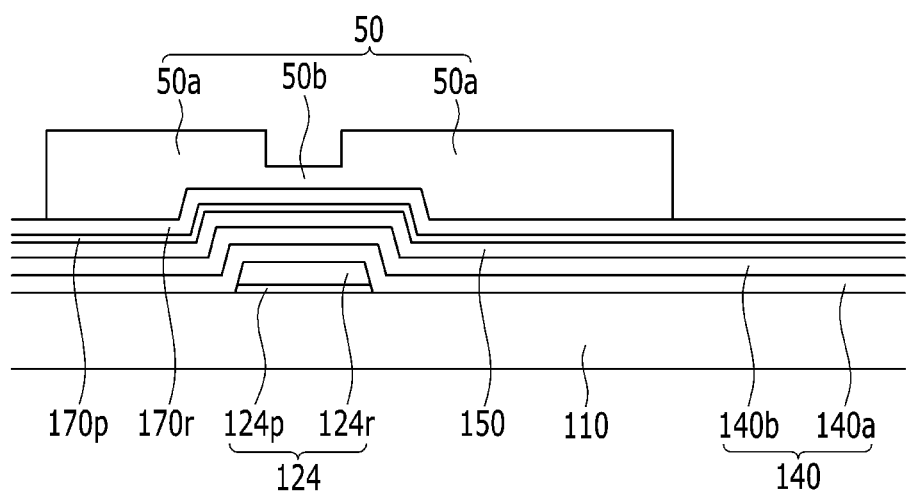

Referring to FIG. 4, a gate insulating layer 140, an oxide layer 150, a metal oxide layer 170p, and a metal layer 170r are deposited on the gate line 121 and the gate electrode 124. In the gate insulating layer 140, a first insulating layer 140a containing a silicon nitride may be deposited and, a second insulating layer 140b containing a silicon oxide may be deposited. The oxide layer 150 may contain at least one of zinc (Zn), indium (In), tin (Sn), gallium (Ga), and hafnium (Hf), the metal oxide layer 170p may contain one of an indium-zinc oxide, a gallium-zinc oxide, and an aluminum-zinc oxide, and the meal layer 170r may contain copper or the copper alloy. Photoresist is formed and thereafter, patterned to form a first photoresist pattern 50 thereon. The first photoresist pattern 50 has a thick first region 50a and a relatively thin second region 50b. A difference in thickness of the first photoresist pattern 50 may be formed by controlling the amount of irradiated light with the mask or by using a reflow method. When the amount of light is controlled, a slit pattern or a lattice pattern or a semitransparent layer may be formed on the mask. The thin second region 50b corresponds to a position where the channel region of the thin film transistor will be formed.

Figure 5:
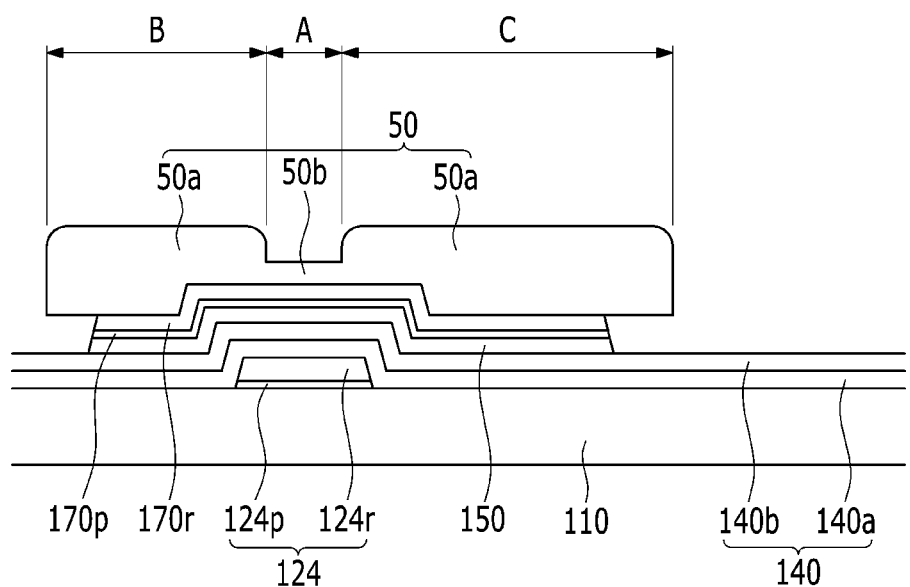

Referring to FIG. 5, the metal oxide layer 170p and the metal layer 170r are etched by using the etchant that may etch both the metal oxide layer 170p and the metal layer 170r by using the first photoresist pattern 50 as the mask. The etchant used herein may be the same as the etchant used when etching the lower layers 121p and 124p and the upper layers 121r and 124r of the gate line 121. As illustrated in FIG. 5, when the metal oxide layer 170p and the metal layer 170r are etched, lateral surfaces of the metal oxide layer 170p and the metal layer 170r covered with the first photoresist pattern 50 are also etched by the etchant, and as a result, as illustrated in FIG. 5, a boundary line of the first metal layer 170p and the second metal layer 170r is disposed inside regions A, B, and C where the first photoresist pattern 50 is formed. In this case, the etchant that etches the metal oxide layer 170p and the metal layer 170r does not etch the gate insulating layer 140 and the oxide layer 150. Additionally, the oxide layer 150 may be etched by using the first photoresist pattern 50 as the mask.

Figure 6:
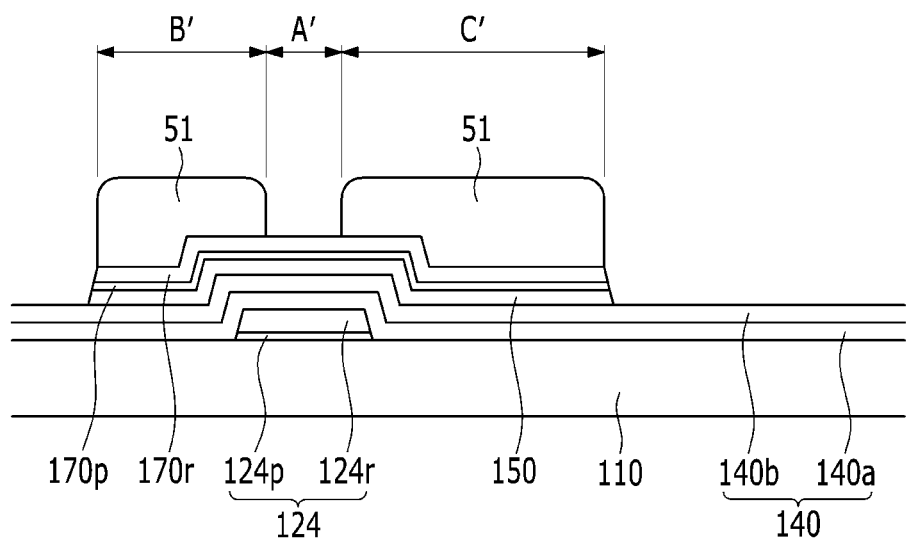

Referring to FIG. 6, the thin second region 50b in FIG. 5 is removed by etch-back. In this case, the first region 50a is also etched, and thus, decreased in width and height to become a second photoresist pattern 51 of FIG. 6. The second photoresist pattern 51 is formed in regions A', B', and C' which are narrower than the regions A, B, and C where the first photoresist pattern 50 is formed in FIG. 5.

Figure 7:
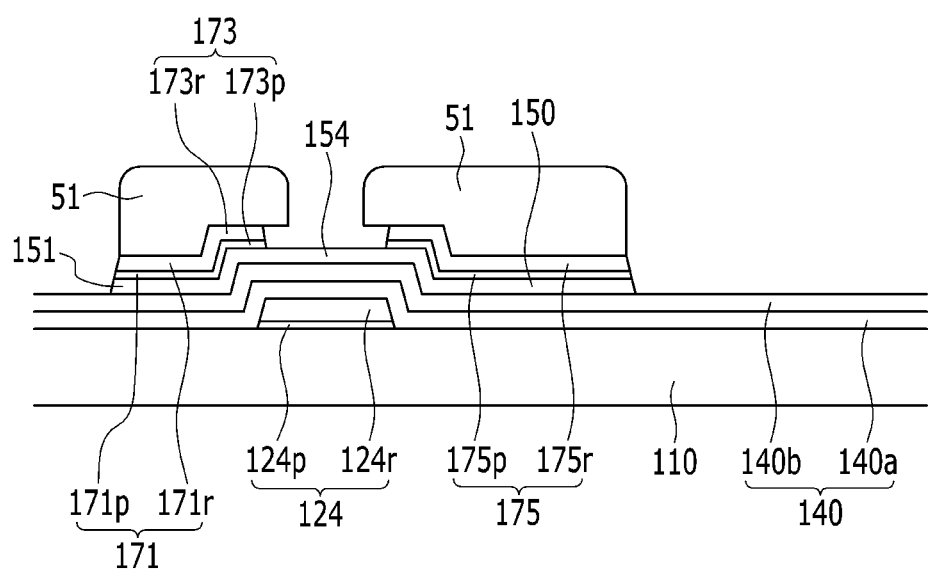

Referring to FIG. 7, the metal oxide layer 170p and the metal layer 170r are etched with the etchant by using the second photoresist pattern 51 as the mask. In this case, the metal oxide layer 170p and the metal layer 170r are separated to form the data lines 171p and 171r, the source electrodes 173p and 173r, and the drain electrodes 175p and 175r having the dual-film structure. Further, the oxide semiconductor layer 151 is formed, which includes the projection 154 forming the channel of the thin film transistor while a top surface of the oxide layer 150 is exposed. When the photoresist patterns having different thicknesses are used, the semiconductor layer 151 with projection 154 are formed, which have the same plane pattern as the lower layers 171p, 173p, and 175p of the data line 171, the source electrode 173, and the drain electrode 175. Meanwhile, the semiconductor layer 151 with projection 154 have substantially the same plane pattern as the data line 171, the source electrode 173, and the drain electrode 175 except for an exposed portion between the drain electrode 175 and the source electrode 173.

Figure 8:
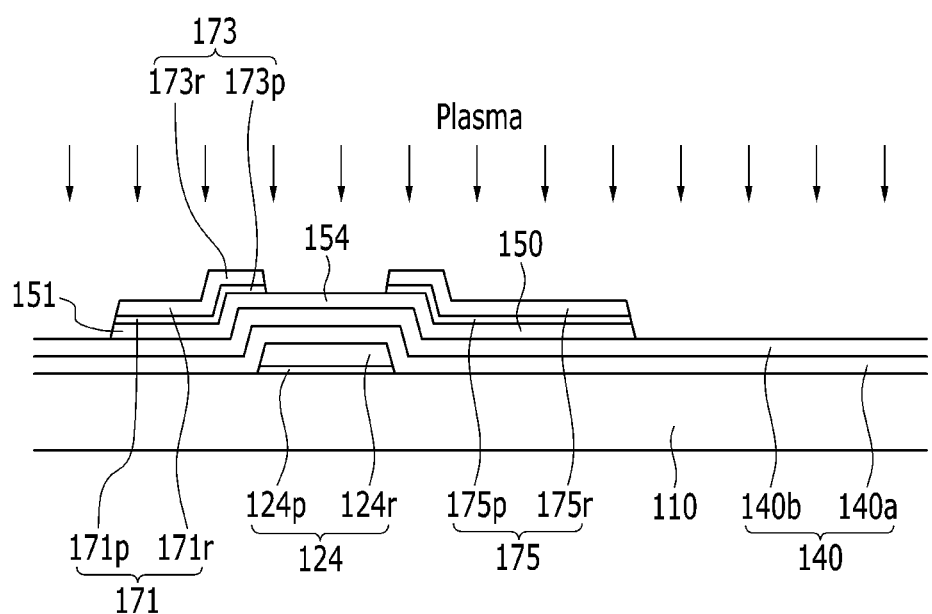

Next, referring to FIG. 8, after the photoresist pattern is removed by ashing, the surfaces of the source electrode 173 and the drain electrode 175 are subjected to fluorocarbon plasma processing.

Figure 9:
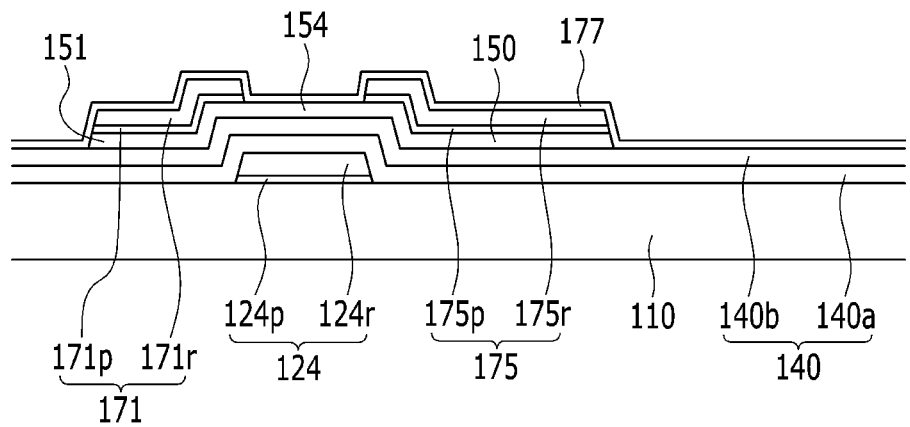

Referring to FIG. 9, the polymer layer 177 is formed on the surfaces of the plasma-processed source electrode 173 and drain electrode 175. In this case, the respective lateral surfaces of the source electrode 173 and the drain electrode 175 adjacent to the channel region of the projection 154 of the semiconductor layer 151 including the exposed portion not covered with the source electrode 173 and the drain electrode 175 are exposed between the source electrode 173 and the drain electrode 175, and the polymer layer 177 is formed to cover the exposed lateral surface of the source electrode and the exposed lateral surface of the drain electrode. The polymer layer 177 may be formed to cover the channel region and the gate insulating layer 140 and/or the surfaces of the source electrode 173 and the drain electrode 175.

Figure 10:
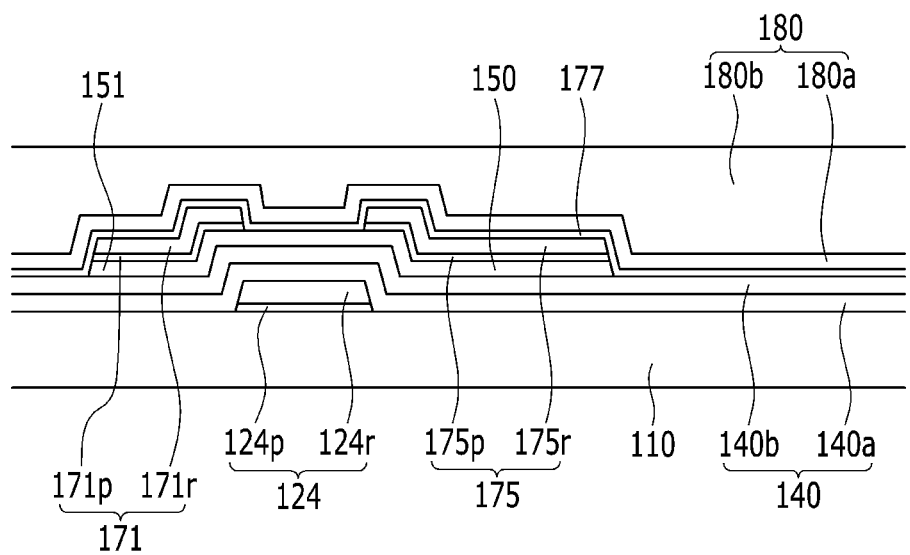

Referring to FIG. 10, the passivation layer 180 is formed on the polymer layer 177. In the passivation layer 180, the lower passivation layer 180a containing a silicon oxide may be formed on the polymer layer 177 and the upper passivation layer 180b containing a silicon nitride may be formed on the lower passivation layer 180a. The contact hole 185 exposing a part of the drain electrode 175 is formed by patterning the passivation layer 180 and the pixel electrode 191 is formed on the passivation layer 180 to form the thin film transistor array panel of FIG. 2. In this case, the pixel electrode 191 is formed to be physically connected with the drain electrode 175 through the contact hole 185.

Figure 11:
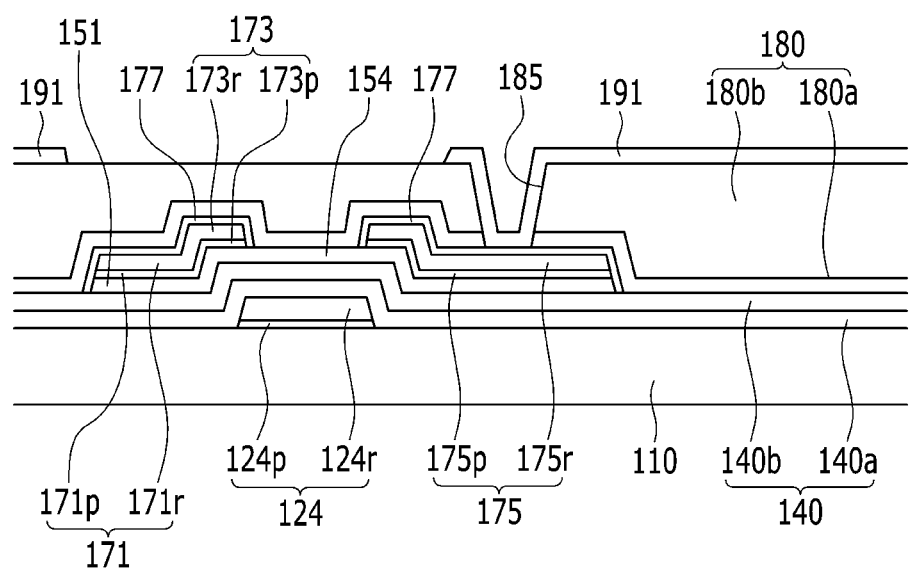
FIG. 11 is a cross-sectional view illustrating a thin film transistor array panel according to an exemplary embodiment of the present disclosure.

FIG. 11 is a cross-sectional view illustrating a thin film transistor array panel according to an exemplary embodiment of the present disclosure. The exemplary embodiment illustrated in FIG. 11 is substantially the same as the exemplary embodiment described in FIG. 2, however, the polymer layer 177 covers only the exposed surfaces of the source electrode 173 and the drain electrode 175 and the polymer layer 177 is not formed on the surface of the projection 154 of the semiconductor layer 151 corresponding to the channel region and the gate insulating layer 140.

Figure 12:
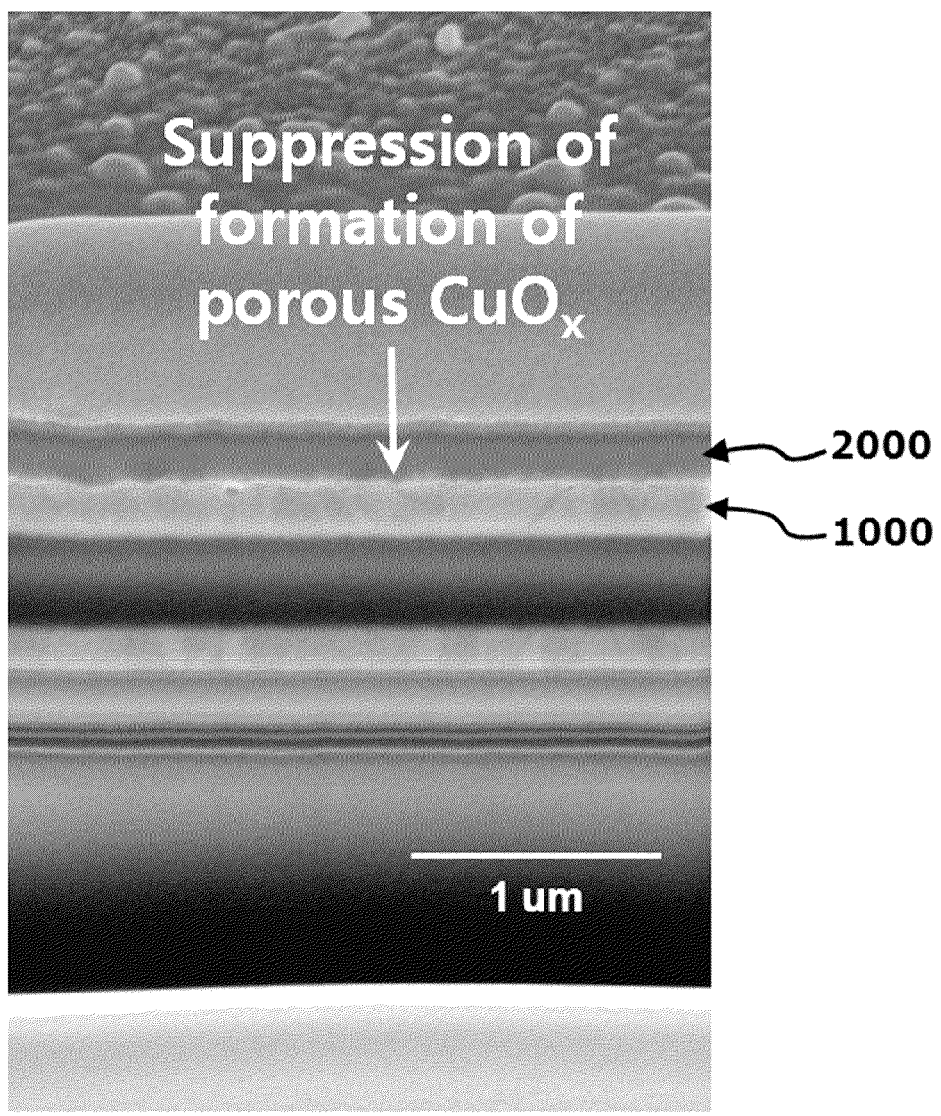
FIG. 12 is a photograph illustrating an interface between a main wiring layer and a passivation layer in a thin film transistor array panel structure according to an exemplary embodiment of the present disclosure.

FIG. 12 is a photograph illustrating an interface between a main wiring layer and a passivation layer in a thin film transistor array panel structure according to an exemplary embodiment of the present disclosure. Referring to FIG. 12, a wiring layer 1000 containing copper on the substrate is formed in order to check a characteristic of the thin film transistor array panel according to the exemplary embodiment of the present disclosure and a passivation layer 2000 containing a silicon oxide is formed after octafluorocyclobutane ($C_4F_8$) plasma-processing the surface of the wiring layer 1000. Thereafter, a photograph picked by an electron microscope is illustrated in FIG. 12 and referring to FIG. 12, it may be verified that an interface shown between the wiring layer 1000 and the passivation layer 2000 is in a clean state in which a contamination source such as the copper oxide is not formed.

Figure 13:
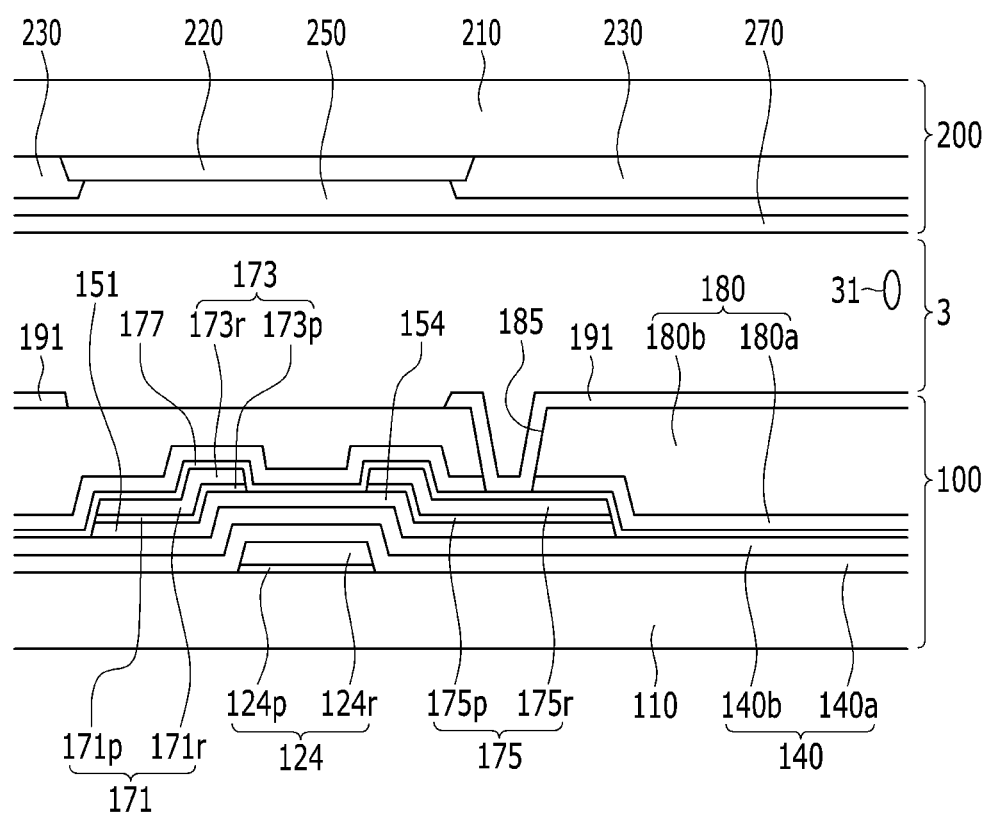
FIG. 13 is a cross-sectional view illustrating a liquid crystal display according to an exemplary embodiment of the present disclosure.

FIG. 13 is a cross-sectional view illustrating a liquid crystal display according to an exemplary embodiment of the present disclosure. Referring to FIG. 13, a second substrate 210 is disposed at a position facing a first substrate 110. The second substrate 210 may be an insulation substrate formed of the transparent glass or plastic. A light blocking member 220 is formed on the second substrate 210. The light blocking member 220 is called a black matrix and blocks light leakage.

A plurality of color filters 230 is also formed on the second substrate 210 and the light blocking member 220. The color filters 230 are most present in a region surrounded by the light blocking member 220 and may elongate along a row of the pixel electrode 191. Each color filter 230 may express one of primary colors such as three primary colors of red, green, and blue colors. However, the expressed colors are not limited to three primary colors of the red, green, and blue colors and each color filter 230 may express one of cyan, magenta, yellow, white based colors. Although the light blocking member 220 and the color filter 230 are formed on an opposed array panel 200 as described above, at least one of the light blocking member 220 and the color filter 230 may be formed on the thin film transistor array panel 100.

An overcoat 250 is formed on the color filter 230 and the light blocking member 220. The overcoat 250 may be formed of the insulation material and prevents the color filter 230 from being exposed and provides a flat surface. The overcoat 250 may be omitted. A common electrode 270 is formed on the overcoat 250.

In operation, a data voltage may be applied to the pixel electrode 191 and a common voltage may be applied to the common electrode 270 to generate an electric field therebetween and to determine a direction of liquid crystal molecules 31 of a liquid crystal layer 3 between both electrodes. The pixel electrode 191 and the common electrode 270 constitute a capacitor to maintain the applied voltage even after the thin film transistor is turned off. The pixel electrode 191 overlaps with a storage electrode line (not illustrated) to constitute a storage capacitor, and as a result, a voltage storing capability of a liquid crystal capacitor may be reinforced.

A content of the exemplary embodiment described by referring to FIG. 2 may be applied to a description of the thin film transistor array panel 100 as illustrated in FIG. 13.

Herein, although the thin film transistor array panel according to the exemplary embodiment is applied to the liquid crystal display, the exemplary embodiment may be widely applied to an organic light emitting device and other display devices that perform a switching operation by using a thin film transistors.

While this invention has been described in connection with what is presently considered to be practical exemplary embodiments, it will be appreciated by those skilled in the art that various modifications and changes may be made without departing from the scope of the present disclosure. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. Thus, while the present disclosure has described certain exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
a gate line disposed on a substrate, the gate line comprising a gate electrode;
a semiconductor layer comprising an oxide semiconductor, the semiconductor layer disposed on the substrate;
a data wiring layer disposed on the substrate, the data wiring layer comprising a data line crossing the gate line a source electrode connected to the data line and a drain electrode facing the source electrode;
a polymer layer covering the source electrode and the drain electrode; and
a passivation layer disposed on the polymer layer,
wherein the data wiring layer comprises coppor or a copper alloy, and
wherein the polymer layer comprises fluorocarbon.

2. The thin film transistor array panel of claim 1, wherein an lateral surface of the source electrode and an lateral surface of the drain electrode are exposed adjacent to a channel region of the semiconductor layer, wherein the channel region comprises an exposed portion which is not covered between the source electrode and the drain electrode, and wherein the polymer layer covers the exposed lateral surface of the source electrode and the exposed lateral surface of the drain electrode.

3. The thin film transistor array panel of claim 2, wherein the data wiring layer comprises a barrier layer and a main wiring layer disposed on the barrier layer, wherein the main wiring layer comprises copper or copper alloy, and wherein the barrier layer comprises a metal oxide.

4. The thin film transistor array panel of claim 3, wherein the passivation layer comprises a lower passivation layer and an upper passivation layer, wherein the lower passivation layer comprises silicon oxide, and wherein the upper passivation layer comprises silicon nitride.

5. The thin film transistor array panel of claim 4, wherein the lower passivation layer contacts the polymer layer at the exposed lateral surface of the source electrode and at the exposed lateral surface of the drain electrode.

6. The thin film transistor array panel of claim 5, wherein the barrier layer comprises at least one of an indium-zinc oxide (IZO), a gallium-zinc oxide (GZO), and an aluminum-zinc oxide (AZO).

7. The thin film transistor array panel of claim 2, wherein the polymer layer covers the channel region.

8. The thin film transistor array panel of claim 1, further comprising a gate insulating layer disposed on the substrate, wherein the gate insulating layer comprises at least one of silicon oxide, silicon nitride, and silicon oxide nitride.

9. The thin film transistor array panel of claim 1, wherein the polymer layer comprises octafluorocyclobutane ($C_4F_8$).

10. The thin film transistor array panel of claim 1, wherein the semiconductor layer has an identical plane pattern as the source electrode, the drain electrode, and the data line except for the channel region.

* * * * *